(12) United States Patent
Froebel et al.

(10) Patent No.: US 7,456,966 B2
(45) Date of Patent: Nov. 25, 2008

(54) ALIGNMENT MARK SYSTEM AND METHOD TO IMPROVE WAFER ALIGNMENT SEARCH RANGE

(75) Inventors: Robert T. Froebel, Fairfax, VT (US); Paul D. Sonntag, Colchester, VT (US); Peter J. Sullivan, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 10/707,864

(22) Filed: Jan. 19, 2004

(65) Prior Publication Data

US 2005/0156334 A1 Jul. 21, 2005

(51) Int. Cl.
*G01B 11/00* (2006.01)
(52) U.S. Cl. .................................................. 356/399
(58) Field of Classification Search ......... 356/399–401, 356/237.1, 237.4; 257/797
See application file for complete search history.

(56) References Cited

U.S. PATENT DOCUMENTS

| | | | | |
|---|---|---|---|---|
| 4,952,060 A | * | 8/1990 | Ina et al. .................. | 356/401 |
| 4,962,318 A | * | 10/1990 | Nishi ......................... | 250/548 |
| 5,347,356 A | * | 9/1994 | Ota et al. ..................... | 356/490 |
| 6,297,876 B1 | * | 10/2001 | Bornebroek ................. | 355/67 |
| 6,870,623 B2 | * | 3/2005 | Tanaka et al. ............... | 356/401 |
| 7,006,225 B2 | * | 2/2006 | Tanaka ....................... | 356/401 |
| 7,158,233 B2 | * | 1/2007 | Tanaka ....................... | 356/401 |
| 2001/0024278 A1 | * | 9/2001 | Yoshida ...................... | 356/401 |

FOREIGN PATENT DOCUMENTS

| | | |
|---|---|---|
| JP | 61116836 A | 6/1986 |
| JP | 7248208 A | 9/1995 |
| JP | 9133508 A | 5/1997 |
| JP | 9138110 A | 5/1997 |
| JP | 9152309 A | 6/1997 |
| RU | 1046734 A1 | 10/1983 |

* cited by examiner

*Primary Examiner*—Tarifur R. Chowdhury
*Assistant Examiner*—Isiaka O Akanbi
(74) *Attorney, Agent, or Firm*—Connolly Bove Lodge & Hutz LLP; Anthony Canale

(57) ABSTRACT

The present invention is a system and method for use with alignment marks and search algorithms of diffraction pattern detection tools. The system and method of the invention significantly increases the capture range of diffraction pattern detection methods and enable more efficient operation of tools employing such detection methods.

11 Claims, 6 Drawing Sheets

ALIGNMENT MARK SYSTEM AND METHOD TO IMPROVE WAFER ALIGNMENT SEARCH RANGE

BACKGROUND OF INVENTION

1. Field of the Invention

The present invention is a system and method for using alignment marks on a substrate for alignment with a photolithographic system.

2. Background of the Invention

Alignment tools, such as photolithographic systems, typically do a global search to provide a coarse alignment of a substrate that is loaded into the system. This coarse alignment locates alignment marks within a specified tolerance and removes large translation and rotation errors in the placement of the substrate in the system before a finer grained alignment is performed for the substrate. Removal of these potentially large errors during coarse alignment enables fine alignment systems to efficiently capture alignment marks on the substrate during the fine alignment process.

Fine alignment systems generally use one of three types of detection methods: bright field, dark field and diffraction pattern. Of these methods, diffraction pattern detection tends to have the smallest capture range during fine alignment. This small capture range is due to the repetition of signal peaks, which are used to identify fine alignment position, in the diffraction of an alignment source signal incident on the diffraction pattern of an alignment mark. The diffraction pattern signal received at a signal detector of the lithographic system has multiple peaks, as shown in FIG. 1A to FIG. 1C. These multiple peaks can cause confusion in determining the proper aligned position of the substrate. The confusion is due to the fact that the multiple peaks appear identical to the alignment system. The capture range of the primary diffracted signal is equal to $+/-\frac{1}{2}$ the period of the diffraction pattern signal. Thus, exceeding this capture range during a search for the proper aligned position of the substrate can lead to large errors in substrate placement and undermine the proper operation of a fine alignment system.

FIG. 1A to FIG. 1C show examples of background art diffraction pattern signals used during coarse alignment. FIG. 1A shows a diffraction pattern signal with a periodicity of 4 μm. This periodicity provides a capture range of +/−2 μm for the coarse alignment of a substrate. FIG. 1B shows a diffraction pattern signal with a periodicity of 5 μm. This periodicity provides a capture range of +/−2.5 μm for the coarse alignment of a substrate. The capture range can be extended by using a diffraction pattern signal that is the sum of diffraction pattern signals, as shown in FIG. 1C. The periodicity of the combined diffraction pattern signals provides an extended capture range of +/−10 μm, as shown in FIG. 1C. Though the approach of FIG. 1C does extend the coarse capture range, further improvement in the performance of alignment systems could be provided by even larger increases in the coarse capture range.

In addition, background art diffraction detection systems use either: (1) a completely separate alignment system that locates the fine alignment marks to less than +/− the fine alignment capture range; or (2) a diffraction alignment system that determines the fine alignment to allowable tolerances using two diffraction gratings of different frequencies. However, the need exists for an alignment technique that increases the coarse capture range and still properly aligns the substrate. Therefore, there is a need for improved coarse capture range in the art of alignment systems.

SUMMARY OF INVENTION

The present invention is a system and method for use with alignment marks and search algorithms of diffraction pattern detection tools. In particular, the system and method of the invention significantly increases the capture range of diffraction pattern detection methods and enables more efficient operation of tools employing such detection methods.

The present invention is a system of alignment marks formed on a substrate, the substrate to be used in a photolithographic system having first and second alignment signal sources and signal detectors, the alignment marks comprising: a first region configured to provide a first signal to the first signal detector in response to the first alignment signal source; and a second region configured to provide a second signal to the second signal detector in response to the second alignment signal source, wherein the first signal determines multiple first coordinates an aligned position of the substrate, the second signal determines multiple second coordinates of an aligned position of the substrate, and the substrate is in a coarse aligned position with the photolithographic system when one of the multiple first coordinates and one of the multiple second coordinates correspond to a maximum received signal strength at the first signal detector and the second signal detector, respectively.

Another embodiment of the present invention is a method for searching and aligning alignment marks formed on a substrate in a diffraction pattern alignment system, comprising: locating a segment of a Y mark in an X mark; illuminating the segment of a Y mark in an X mark with a Y-alignment signal source; measuring received signal strength of the diffraction pattern at a first signal detector; moving the X mark in an X-direction; repeating the illuminating, measuring and moving until the received signal strength of the diffraction pattern at the first signal detector is zero; determining a location of an approximate center of the segment of a Y mark in an X mark as a maximum of the measured received signal strength; illuminating the X mark with the X-alignment signal source; detecting multiple aligned positions received at a second signal detector as a result of illuminating the X mark; searching the multiple aligned positions detected for a single aligned position in the X-direction that corresponds to the location of the approximate center of the segment of a Y mark in an X mark; and selecting an aligned position of the X mark in the X-direction in accordance with the single aligned position that corresponds to the location of the approximate center of a Y mark in an X mark.

Yet another embodiment of the present invention is a method for searching and aligning alignment marks formed on a substrate in a diffraction pattern alignment system, comprising: locating a segment of an X mark in a Y mark; illuminating the segment of an X mark in a Y mark with an X-alignment signal source; measuring received signal strength of the diffraction pattern at a first signal detector; moving the Y mark in a Y-direction; repeating the illuminating, measuring and moving until the received signal strength of the diffraction pattern at the first signal detector is zero; determining a location of an approximate center of the segment of an X mark in a Y mark as a maximum of the measured received signal strength; illuminating the Y mark with the Y alignment signal source; detecting multiple aligned positions received at a second signal detector as a result of illuminating the Y mark; searching the multiple aligned positions detected for a single aligned position in the Y-direction that corresponds to the location of the approximate center of the segment of an X mark in a Y mark; and selecting an aligned position of the Y mark in the Y-direction in accordance with the single aligned position that corresponds to the location of the approximate center of an X mark in a Y mark.

DETAILED DESCRIPTION

Figure 1A:
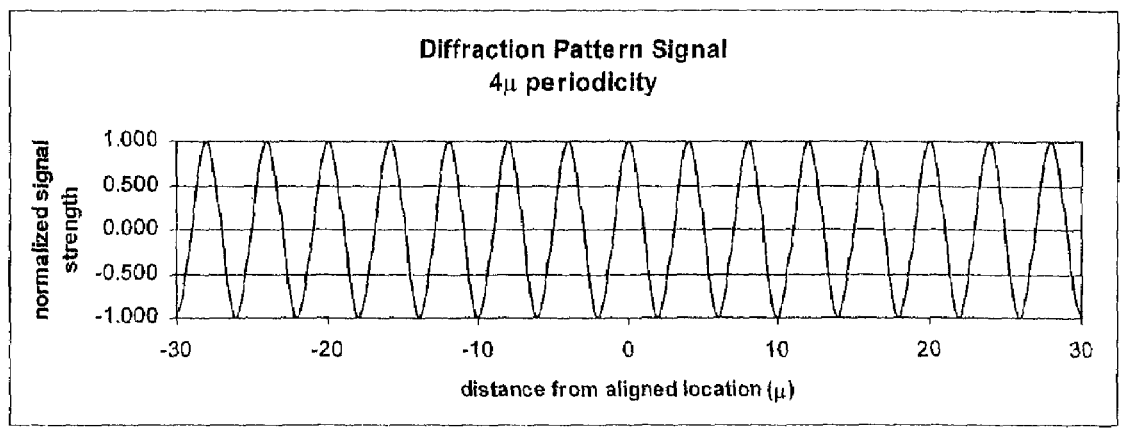
FIG. 1A is an example of a diffraction pattern signal of 4 μ periodicity in the background art.
Figure 1B:
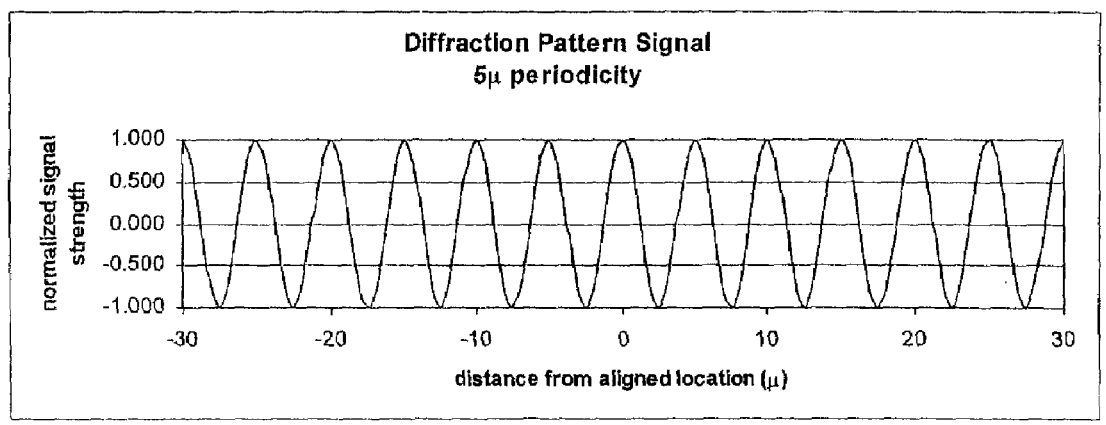
FIG. 1B is an example of a diffraction pattern signal of 5 μ periodicity in the background art.
Figure 1C:
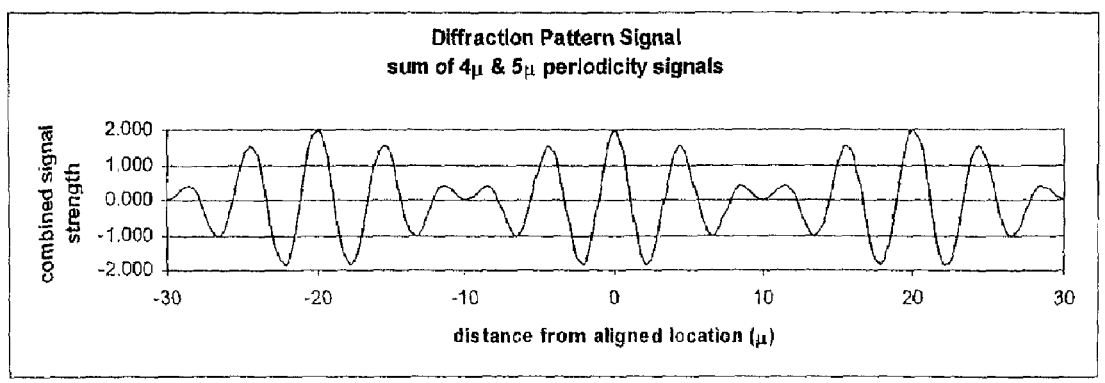
FIG. 1C is an example of a diffraction pattern signal that is the sum of 4 μ and 5 μ periodicity in the background art.
Figure 2:
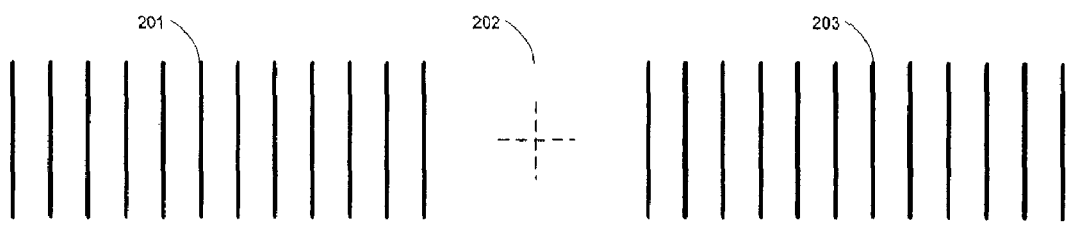
FIG. 2 is an example of an alignment mark in the background art.
Figure 3:
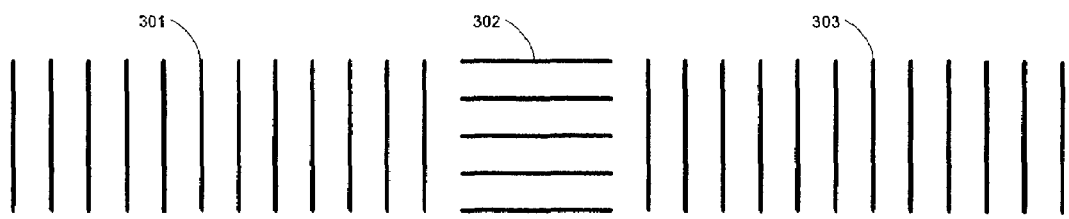
FIG. 3 shows a first embodiment of the alignment mark of the present invention.

FIG. 2 shows an example of alignment marks 201, 203 used in the background art of alignment systems. FIG. 3 shows a first embodiment of the alignment mark of the present invention. The embodiment shown in FIG. 3 is an alignment mark comprising an X mark 301, 303 with a segment of a Y mark 302 in the X mark 301, 303. In the non-limiting example shown in FIG. 3, the segment of a Y mark 302 in the X mark 301, 303 is located in the middle portion of the X mark 301, 303. Moreover, a Y mark further comprising a segment of an X mark in the Y mark can also be represented by FIG. 3 when the figure is rotated by +/−90°.

Figure 4:
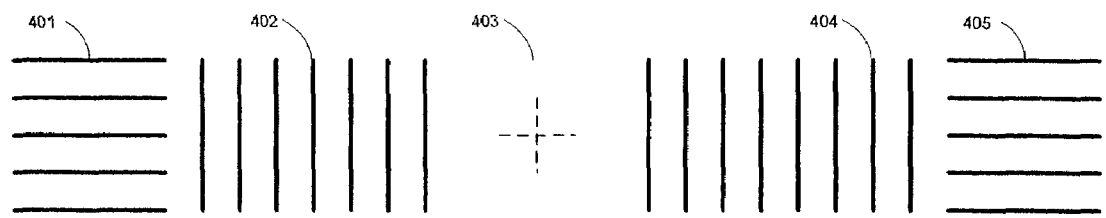
FIG. 4 shows a second embodiment of the alignment mark of the present invention.

FIG. 4 shows a second embodiment of the alignment mark of the present invention. The embodiment shown in FIG. 4 is an alignment mark comprising an X mark 402, 404, wherein the segment of a Y mark 401, 405 in an X mark 402, 404 are located at each end of the X mark. Moreover, as discussed above for FIG. 3, a Y mark further comprising a segment of an X mark in the Y mark can also be represented by FIG. 4 when the figure is rotated by +/−90°.

Figure 5:
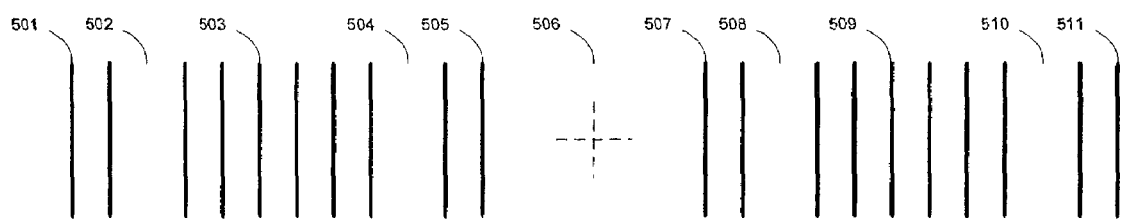
FIG. 5 shows a third embodiment of the alignment mark of the present invention.

FIG. 5 shows a third embodiment of the alignment mark of the present invention. The embodiment shown in FIG. 5 is an alignment mark comprising an X mark 501, 503, 505, 507, 509, 511, wherein at least one segment or line of the X mark 502, 504, 508, 510 is removed. In general, segments/lines of either an X mark or a Y mark may be removed to eliminate regions of the X mark and Y mark that cause false alignments. In addition, a method for designing the alignment mark may further comprise removing a segment/line in the X mark that at least one of contribute the majority of the signal strength and require minimum signal strength. Further, removing a segment/line may further comprise replacing the removed segment/line with marks of an opposite axis to provide, for example, a coarse position check.

Moreover, at least one segment/line of an X mark and/or at least one segment/line of a Y mark may be removed and replaced by at least one segment/line with a different orientation than the X mark and/or Y mark, respectively. FIG. 3, as discussed above, shows an example of an X mark 301, 303 with a middle segment removed and replaced by a segment of a Y mark 302 that has a different orientation than the X mark 301, 303. The different orientation of the segment is at least in the range of +/−45° to +/−90° relative to the orientation of the X mark and Y mark.

Figure 6:
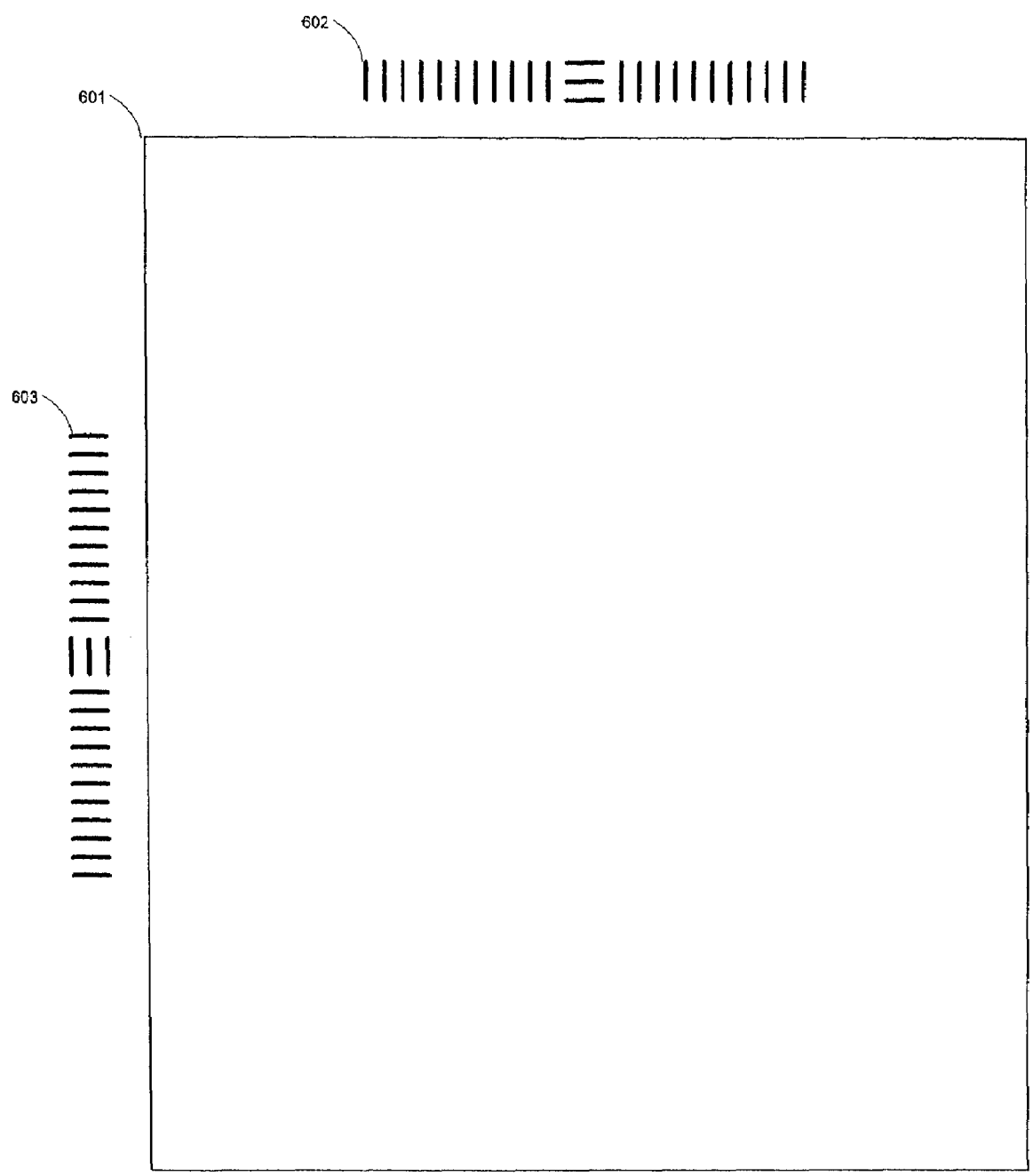
FIG. 6 shows an exemplary embodiment of the alignment mark system of the present invention on a substrate.

FIG. 6 shows an embodiment of the alignment mark system of the present invention on a substrate 601. In particular, the alignment mark system of FIG. 6 has a first region 602 configured to provide a first signal to a signal detector in response to a first alignment signal source. In addition, the alignment mark system has a second region 603 configured to provide a second signal to the signal detector in response to a second alignment signal source. The first region 602 and the second region 603 are an X mark diffraction pattern and a Y mark diffraction pattern, respectively. The first signal determines a multiple first coordinates (e.g., X-coordinates) of an aligned position of the substrate 601. The second signal determines multiple second coordinates (e.g., Y-coordinates) of an aligned position of the substrate 601. In the embodiment of the present invention shown in FIG. 6, the substrate 601 is in an aligned position with the photolithographic system when one of the first coordinates and one of the second coordinates correspond to the maximum received signal strength at the signal detectors for the first and second signals, respectively.

Figure 7A:
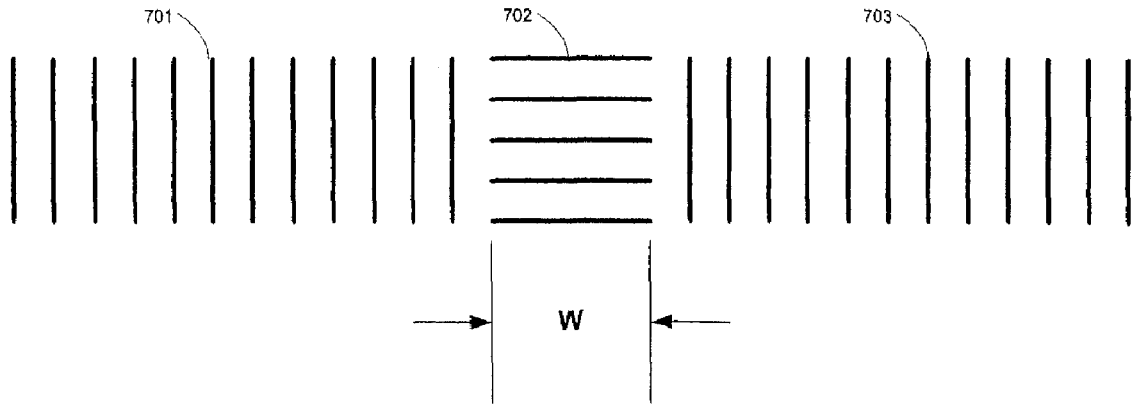
FIG. 7A shows an embodiment of an X mark with a segment of a Y mark of width W.

FIG. 7A shows an embodiment of an X mark 701, 703 that has a segment of a Y mark 702 with a predetermined width W located in a middle portion of the X mark 701, 703. A non-limiting example of the width W is 25 μm to 75 μm.

Figure 7B:
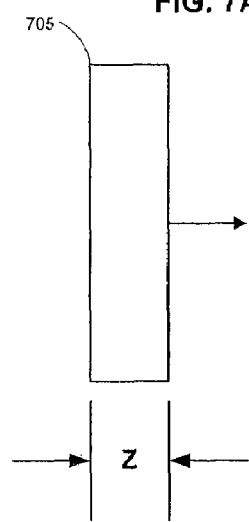
FIG. 7B shows an alignment source of width Z.

FIG. 7B shows a beam 705 of an alignment signal source of width Z. A non-limiting example of a typical width Z for the beam of the alignment signal source is 50 μm. The beam 705 of the alignment signal source is used to illuminate the alignment mark 702 of FIG. 7A. Note that alignment marks 701 and 703 are aligned at 90° relative to the beam 705 of the alignment signal source. Nonlimiting examples of alignment signal sources include a laser and any broadband light source.

Figure 7C:
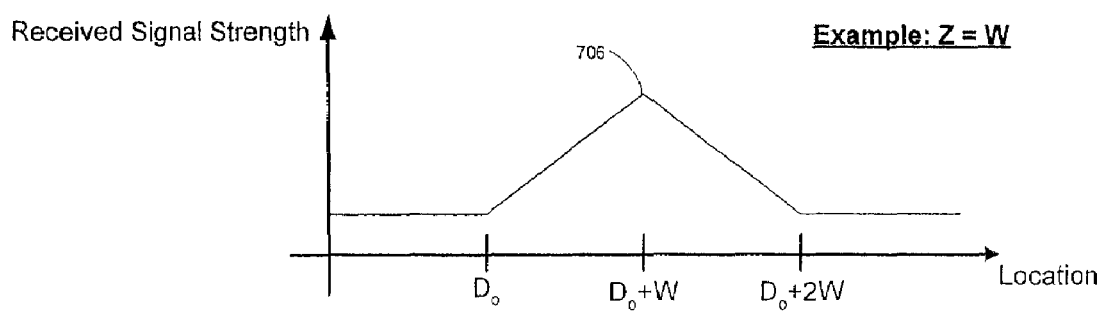
FIG. 7C shows the received signal strength at a signal detector as a result of multiple scans of an X mark with a segment of a Y mark of width W by an alignment source of width W.

FIG. 7C shows a non-limiting example of the received signal strength at a signal detector as a result of multiple scans of an alignment mark 701, 702, 703 by a beam 705 of an alignment signal source with width Z=W. The beam 705 may also have a width Z>W or Z<W. For the case of Z=W shown in FIG. 7C, the maximum of the signal strength 706 received at the signal detector as a result of illumination by the beam 705 occurs at the approximate center position of the Y mark segment of width W. This approximate center position is used in the method described below to determine the coordinates for aligned position of the substrate and to extend the capture range.

Figure 8:
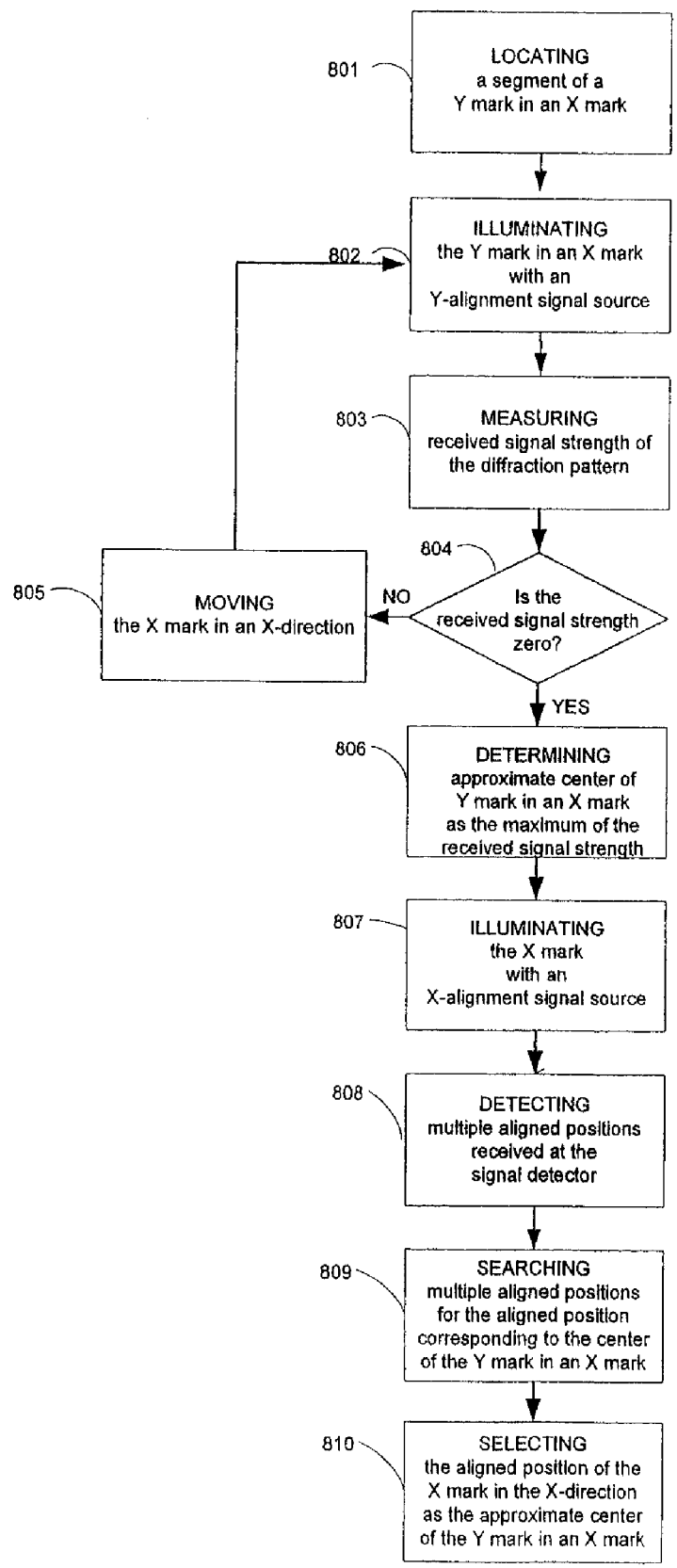
FIG. 8 is a flow diagram for a method for aligning an X mark in the X-direction.

FIG. 8 is a flow diagram for a method for aligning an X mark in the X-direction. Step 801 of FIG. 8, involves locating a segment of a Y mark in an X mark. Next, step 802 involves illuminating the segment of a Y mark in an X mark with a Y-alignment signal source. In step 803, measuring the received signal strength of the diffraction pattern at a signal detector is performed. During step 804, it is determined whether or not the measured received signal strength is zero. If the measured received signal strength is not zero, (1) the X mark is moved in an X-direction in step 805; and (2) step 802 and step 803 are repeated. If the measured received signal strength is zero, the approximate center of the Y mark in an X mark is determined as the maximum of the received signal strength in step 806. Further, in step 805 of FIG. 8, moving the segment of the X mark in an X-direction is performed by moving the X mark in relation to the Y-alignment signal source by a specified amount in the X-direction until the Y-alignment signal source is past the segment of a Y mark in an X mark.

Next step 807 of FIG. 8 involves illuminating the X mark with an X-alignment signal source. Step 808 involves detecting multiple aligned positions received at the signal detector as a result of illuminating the X mark in step 807. In step 809, the multiple aligned positions detected in step 808 are searched for a single aligned position in the Y-direction that corresponds to the location of the approximate center of the segment of a Y mark in an X mark. Step 810 involves selecting an aligned position of the X mark in the X-direction in accordance with the single aligned position that corresponds to the location of the approximate center of a Y mark in an X mark. In addition, selecting an aligned position for the alignment mark may also comprise determining whether the received signal strength is greater than or equal to a predetermined threshold. After aligning the X mark in the X-direction, aligning the Y mark in the Y-direction is performed as discussed below.

Figure 9:
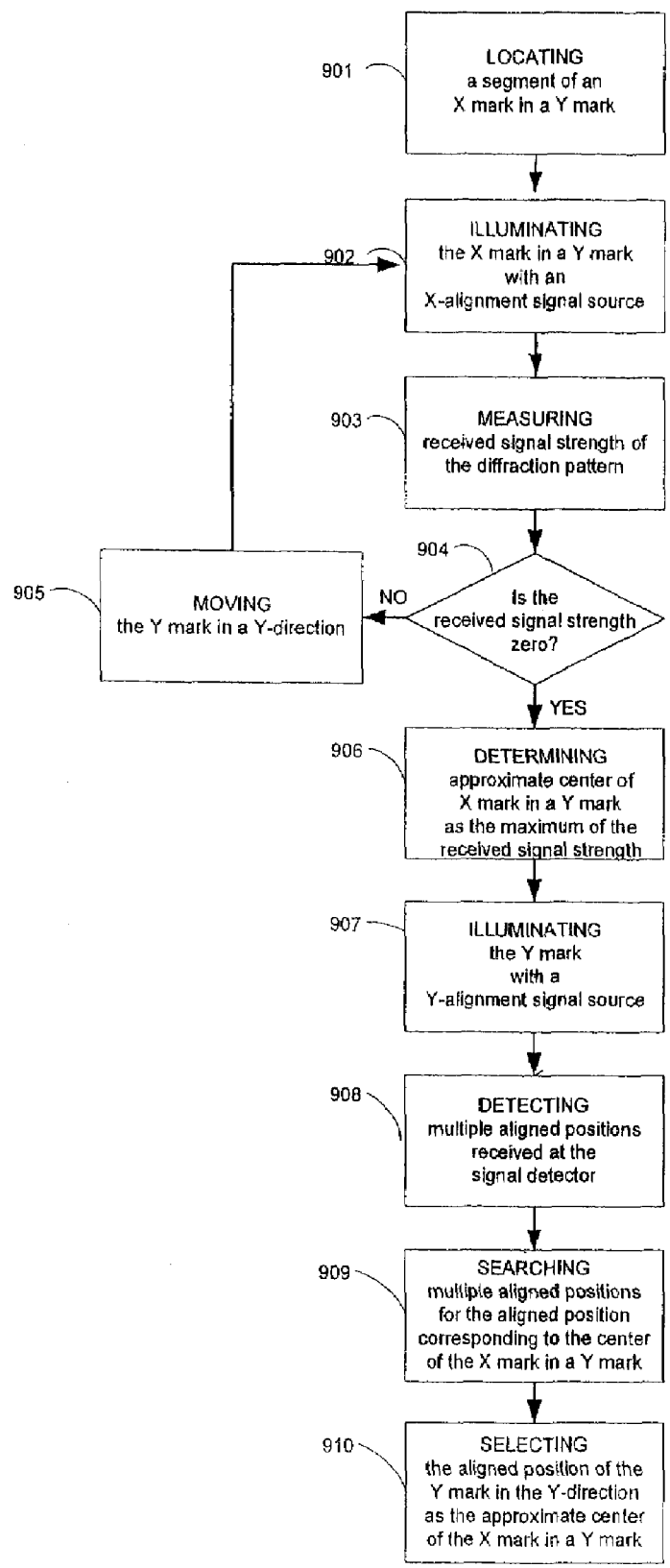
FIG. 9 is a flow diagram for a method for aligning an Y mark in the Y-direction.

FIG. 9 is a flow diagram for a method for aligning a Y mark in the Y-direction. Step 901 of FIG. 9, involves locating a segment of an X mark in a Y mark. Next, step 902 involves illuminating the segment of an X mark in a Y mark with an X-alignment signal source. In step 903, measuring the received signal strength of the diffraction pattern at a signal detector is performed. During step 904, it is determined whether or not the measured received signal strength is zero. If the measured received signal strength is not zero, (1) the Y mark is moved in a Y-direction in step 905; and (2) step 902 and step 903 are repeated. If the measured received signal strength is zero, the approximate center of the X mark in a Y mark is determined as the maximum of the received signal strength in step 906. Further, in step 905 of FIG. 9, moving the segment of the Y mark in a Y-direction is performed by moving the Y mark in relation to the X-alignment signal source by a specified amount in the Y-direction until the X-alignment signal source is past the segment of an X mark in a Y mark.

Next step 907 of FIG. 9 involves illuminating the Y mark with a Y-alignment signal source. Step 908 involves detecting multiple aligned positions received at the signal detector as a result of illuminating the Y mark in step 907. In step 909, the multiple aligned positions detected in step 908 are searched for a single aligned position in the X-direction that corresponds to the location of the approximate center of the segment of an X mark in a Y mark. Step 910 involves selecting an aligned position of the Y mark in the Y-direction in accordance with the single aligned position that corresponds to the location of the approximate center of an X mark in a Y mark. In addition, selecting an aligned position for the alignment mark may also comprise determining whether the received signal strength is greater than or equal to a predetermined threshold.

The foregoing description illustrates and describes the present invention. Additionally, the disclosure shows and describes only the preferred embodiments of the invention, but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form or application disclosed herein. Also, it is intended that the appended claims be construed to include alternative embodiments.

The invention claimed is:

1. A system of alignment marks formed on a substrate, the substrate to be used in a photolithographic system having first and second alignment signal sources, each having a width Z, and signal detectors, the alignment marks comprising:
   a first region configured to provide a first signal to the first signal detector in response to the first alignment signal source having a width Z; and
   a second region configured to provide a second signal to the second signal detector in response to the second alignment signal source having a width Z,
   wherein the first signal determines multiple first coordinates of an aligned position of the substrate, the second signal determines multiple second coordinates of an aligned position of the substrate, and the substrate is in a coarse aligned position with the photolithographic system when one of the multiple first coordinates and one of the multiple second coordinates correspond to a maximum received signal strength at the first signal detector and the second signal detector, respectively,
   wherein the first region and the second region are an X mark diffraction pattern and a Y mark diffraction pattern, respectively,
   wherein the X mark diffraction pattern further comprises a segment of a Y mark in the X mark and the Y mark diffraction pattern further comprises a segment of an X mark in the Y mark,
   wherein a segment of a Y mark and a segment of the X mark are removed,
   wherein each segment removed corresponds to regions of the X mark and Y mark that cause false alignments,
   wherein an approximate center of a Y mark in the X mark is determined from the width Z of the first alignment signal source and the maximum received signal strength at the first signal detector, and
   wherein an approximate center of the X mark in the Y mark is determined from a width Z of the second alignment signal source and the maximum received signal strength at the second signal detector,
   wherein, when the width Z of the first alignment signal source and the second alignment signal source equals a width W of the X mark and the Y mark, respectively, single points of the maximum received signal strengths indicates an exact location of the center of each the X mark and the Y mark.

2. The system of alignment marks of claim 1, wherein the segment of an X mark in the Y mark and the segment of a Y mark in the X mark are located at each end of the X mark and Y mark, respectively.

3. The system of alignment marks of claim 1, wherein the segment of an X mark in the Y mark and the segment of a Y mark in the X mark are located in a middle portion of the X mark and Y mark, respectively.

4. The system of alignment marks of claim 1, wherein a segment of the Y mark and a segment of the X mark are removed and replaced by segments of a different orientation than the X mark and the Y mark, respectively.

5. The system of alignment marks of claim 4, wherein the segments of different orientation are located from +/−45° to +/−90° relative to the X mark and the Y mark.

6. A method for searching and aligning alignment marks formed on a substrate in a diffraction pattern alignment system, comprising:

locating a segment of a Y mark in an X mark;

illuminating the segment of a Y mark in an X mark with a Y-alignment signal source having a width Z;

measuring received signal strength of the diffraction pattern at a first signal detector; moving the X mark in an X-direction;

repeating the illuminating, measuring and moving until the received signal strength of the diffraction pattern at the first signal detector is zero;

determining a location of an approximate center of the segment of a Y mark in an X mark as a maximum of the measured received signal strength;

illuminating the X mark with the X-alignment signal source;

detecting multiple aligned positions received at a second signal detector as a result of illuminating the X mark;

searching the multiple aligned positions detected for a single aligned position in the X-direction that corresponds to the location of the approximate center of the segment of a Y mark in an X mark; and selecting an aligned position of the X mark in the X-direction in accordance with the single aligned position that corresponds to the location of the approximate center of a Y mark in an X mark, wherein the approximate center of a Y mark in an X mark is further determined from the width Z of the Y-alignment signal source and a location of the maximum of the measured received signal strength, and wherein, when the width Z of the first alignment signal source and the second alignment signal source equals a width W of the X mark and the Y mark, respectively, single points of the maximum received signal strengths indicates an exact location of the center of each the X mark and the Y mark.

7. The method of claim 6, wherein moving the X mark in an X-direction is performed by moving the X mark in relation to the Y-alignment signal source by a specified amount in the X-direction until the Y-alignment signal source has passed the segment of a Y mark in an X mark.

8. The method of claim 6, wherein selecting the aligned position occurs when the maximum of the received signal strength is greater than or equal to a predetermined threshold.

9. A method for searching and aligning alignment marks formed on a substrate in a diffraction pattern alignment system, comprising:

locating a segment of an X mark in a Y mark;

illuminating the segment of an X mark in a Y mark with an X-alignment signal source with a width Z;

measuring received signal strength of the diffraction pattern at a first signal detector;

moving the Y mark in a Y-direction;

repeating the illuminating, measuring and moving until the received signal strength of the diffraction pattern at the first signal detector is zero;

determining a location of an approximate center of the segment of an X mark in a Y mark as a maximum of the measured received signal strength;

illuminating the Y mark with the Y alignment signal source;

detecting multiple aligned positions received at a second signal detector as a result of illuminating the Y mark;

searching the multiple aligned positions detected for a single aligned position in the Y-direction that corresponds to the location of the approximate center of the segment of an X mark in a Y mark; and selecting an aligned position of the Y mark in the Y-direction in accordance with the single aligned position that corresponds to the location of the approximate center of an X mark in a Y mark, wherein the approximate center of the X mark in a Y mark is further determined from the width Z of the X-alignment signal source and a location of the maximum measured received signal strength, and wherein, when the width Z of the first alignment signal source and the second alignment signal source equals a width W of the X mark and the Y mark, respectively, a single point of the maximum received signal strength indicates a location of the center of each the X mark and the Y mark.

10. The method of claim 9, wherein moving the Y mark in the Y-direction is performed by moving the Y mark in relation to the X-alignment signal source by a specified amount in the Y-direction until the X-alignment signal source has passed the segment of an X mark in a Y mark.

11. The method of claim 9, wherein selecting the aligned position occurs when the maximum of the received signal strength is greater than or equal to a predetermined threshold.

* * * * *